(12) United States Patent
Kim et al.

(10) Patent No.: US 9,131,601 B2
(45) Date of Patent: Sep. 8, 2015

(54) MOBILE TERMINAL

(71) Applicant: LG ELECTRONICS INC., Seoul (KR)

(72) Inventors: Chiyoung Kim, Seoul (KR); Dongwook Kim, Gimpo (KR); Kyungsoo Son, Gwangmyeong (KR); Hyeongwoo Ji, Gwangmyeong (KR)

(73) Assignee: LG ELECTRONICS INC., Seoul (KR)

( * ) Notice: Subject to any disclaimer, the term of this patent is extended or adjusted under 35 U.S.C. 154(b) by 306 days.

(21) Appl. No.: 13/740,764

(22) Filed: Jan. 14, 2013

(65) Prior Publication Data

US 2013/0215559 A1    Aug. 22, 2013

(30) Foreign Application Priority Data

Feb. 16, 2012    (KR) .................. 10-2012-0016005

(51) Int. Cl.
  *H05K 7/00*    (2006.01)
  *H05K 5/02*    (2006.01)
  *H04M 1/02*    (2006.01)
  *G06F 1/16*    (2006.01)
  *G06F 3/044*    (2006.01)

(52) U.S. Cl.
  CPC ............ *H05K 5/0217* (2013.01); *G06F 1/1626* (2013.01); *G06F 1/1633* (2013.01); *G06F 3/044* (2013.01); *H04M 1/0249* (2013.01); *G06F 2203/04108* (2013.01)

(58) Field of Classification Search
  CPC .......................... H05K 9/0058; G02B 6/4201
  USPC ............ 361/679.01–679.09, 679.55–679.59, 361/679.26–679.29; 455/575.1, 575.3, 455/575.4, 575.8; 411/107, 353, 418, 999
  See application file for complete search history.

(56) References Cited

U.S. PATENT DOCUMENTS

| | | | | |
|---|---|---|---|---|
| 2,809,686 | A | * | 10/1957 | Shepherd ....................... 411/104 |
| 3,785,421 | A | * | 1/1974 | Launay ......................... 411/108 |
| 6,536,621 | B2 | * | 3/2003 | Yokobori ...................... 220/4.02 |
| 8,696,278 | B2 | * | 4/2014 | Babej et al. .................... 411/113 |

* cited by examiner

*Primary Examiner* — Jerry Wu
(74) *Attorney, Agent, or Firm* — Birch, Stewart, Kolasch & Birch, LLP

(57) ABSTRACT

A mobile terminal is provided. The mobile terminal includes a case defining an appearance of the terminal and a frame coupled to the case and configured to support electrical devices. The frame includes a first coupling unit provided at the frame such that the frame is fixable to the case, the first coupling unit having a first hole formed therein and a second coupling unit provided at the frame and located adjacent to the first coupling unit, the second coupling unit having a second hole formed therein, the first hole being greater in size than the second hole. The mobile terminal also includes a first boss unit integrally coupled to the first coupling unit and the second coupling unit.

14 Claims, 10 Drawing Sheets

MOBILE TERMINAL

CROSS-REFERENCE TO RELATED APPLICATIONS

Pursuant to 35 U.S.C. §119(a), this application claims the benefit of earlier filing date and right of priority to Korean Application No. 10-2012-0016005, filed on Feb. 16, 2012, the contents of which is incorporated by reference herein in its entirety.

BACKGROUND OF THE INVENTION

1. Field of the Invention

This specification relates to a coupling structure of a mobile terminal.

2. Description of Related Art

As it becomes multifunctional, a mobile terminal can be allowed to capture still images or moving images, play music or video files, play games, receive broadcast and the like, so as to be implemented as an integrated multimedia player.

Terminals may be divided into mobile/portable terminals and stationary terminals according to their mobility. Mobile terminals (mobile device, portable device, portable terminal) can be easily carried and have one or more of functions such as supporting voice and video telephony calls, inputting and/or outputting information, storing data and the like.

Many efforts are undergoing to support or enhance various functions of such mobile terminals. Such many efforts include not only changes and improvement of structural components implementing a mobile terminal but also software or hardware improvement.

In particular, a case of a mobile terminal is formed by a front case and a rear case coupled to each other, to define an appearance of the terminal. A frame which is formed to support an inside of the terminal may be coupled to the case.

Therefore, a more improved coupling structure among components of the terminal may be taken into account, as an approach for extending functions of the terminal or increasing rigidity of a body of the terminal.

BRIEF SUMMARY OF THE INVENTION

Therefore, an aspect of the detailed description is to provide a coupling structure which allows more stable coupling upon coupling a frame and a case to each other using screws.

Another aspect of the detailed description is to provide a coupling structure of a terminal capable of preventing screws from being loosed.

To achieve these and other advantages and in accordance with the purpose of this specification, as embodied and broadly described herein, there is provided a mobile terminal including a case defining an appearance of the terminal, a frame coupled to the case and configured to support electrical devices, and a first boss unit, wherein the frame may include a first coupling unit formed through the frame such that the frame is fixed onto the case, and a second coupling unit formed through the frame with being located adjacent to the first coupling unit. Here, the first boss unit may be integrally coupled to the first coupling unit and the second coupling unit.

In accordance with one aspect of the present disclosure, the first coupling unit may include a first hole formed on an inner circumference thereof, and the second coupling unit may include a second hole formed on an inner circumference thereof, the first hole being greater than the second hole in size.

In accordance with one aspect of the present disclosure, the second coupling unit may be spaced apart from the first coupling unit, and provided in plurality.

In accordance with one aspect of the present disclosure, the first coupling unit may have at least a part protruding toward the case.

In accordance with one aspect of the present disclosure, the first boss unit may cover the protruding portion of the first coupling unit.

In accordance with one aspect of the present disclosure, the first boss unit may extend toward the case.

In accordance with one aspect of the present disclosure, the first boss unit may include a coupling member with a screw groove. The coupling member may be formed along an inner circumference such that a screw is coupled thereinto.

In accordance with one aspect of the present disclosure, the coupling member may be integrally formed with the first boss unit by injection molding.

In accordance with one aspect of the present disclosure, the case may include a through hole coaxially coupled to a hole formed on an inner circumference of the first boss unit.

In accordance with one aspect of the present disclosure, a screw coupled into the first boss unit via the through hole may include a head member contacting one surface of the case and a load member coupled to the coupling member, and the case may include a second boss unit formed on one surface thereof and each having a concavo-convex pattern to increase friction with the head member.

In accordance with one aspect of the present disclosure, the case may include grooves in which the second boss unit is inserted, and the second boss unit may include protrusions corresponding to the grooves.

In accordance with one aspect of the present disclosure, the case may be made of synthetic resin and the second boss unit may be made of a metal.

In accordance with one aspect of the present disclosure, the second boss unit and the case may be integrally formed with each other by injection molding.

In accordance with one aspect of the present disclosure, the frame may be made of a metal, and the first boss unit may be formed of synthetic resin.

In accordance with one aspect of the present disclosure, the first boss unit may be integrally formed with a support portion. Here, the support portion may extend to cover at least one side surface of the frame.

In accordance with another exemplary embodiment of the present disclosure, there is provided a mobile terminal including a case defining an appearance of the terminal, a frame coupled to the case and configured to support electrical devices, holes formed on the frame, and first boss units having coupling members in which screws are inserted via the case, respectively, at least a part of each of the first boss units being inserted into the hole to be integrally coupled to the frame.

In accordance with at least one exemplary embodiment of the present disclosure, a mobile terminal may be configured to prevent damages on a case or a frame which may be caused when the case or frame is fixed by screws.

Also, loosing of the screws may be prevented, resulting in fixing the frame to the case more firmly.

Further scope of applicability of the present application will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the detailed description.

BRIEF DESCRIPTION OF THE DRAWINGS

The accompanying drawings, which are included to provide a further understanding of the invention and are incorporated in and constitute a part of this specification, illustrate exemplary embodiments and together with the description serve to explain the principles of the invention. In the drawings.

DETAILED DESCRIPTION OF THE INVENTION

Description will now be given in detail of preferred configurations of mobile terminals according to the present invention, with reference to the accompanying drawings. Hereinafter, suffixes "module" and "unit or portion" for components used herein in description are merely provided only for facilitation of preparing this specification, and thus they are not granted a specific meaning or function. Hence, it should be noticed that "module" and "unit or portion" can be used together.

Mobile terminals may be implemented using a variety of different types of terminals. Examples of such terminals include mobile terminals, such as mobile phones, smart phones, notebook computers, digital broadcast terminals, Personal Digital Assistants (PDA), Portable Multimedia Players (PMP), navigators and the like, and stationary terminals, such as digital TVs, desktop computers and the like. The following description assumes that the terminal is a mobile terminal. However, it can be easily understood by those skilled in the art that the configuration according to the following description can be applied to the stationary terminals except for components particularly provided for mobility.

Figure 1:
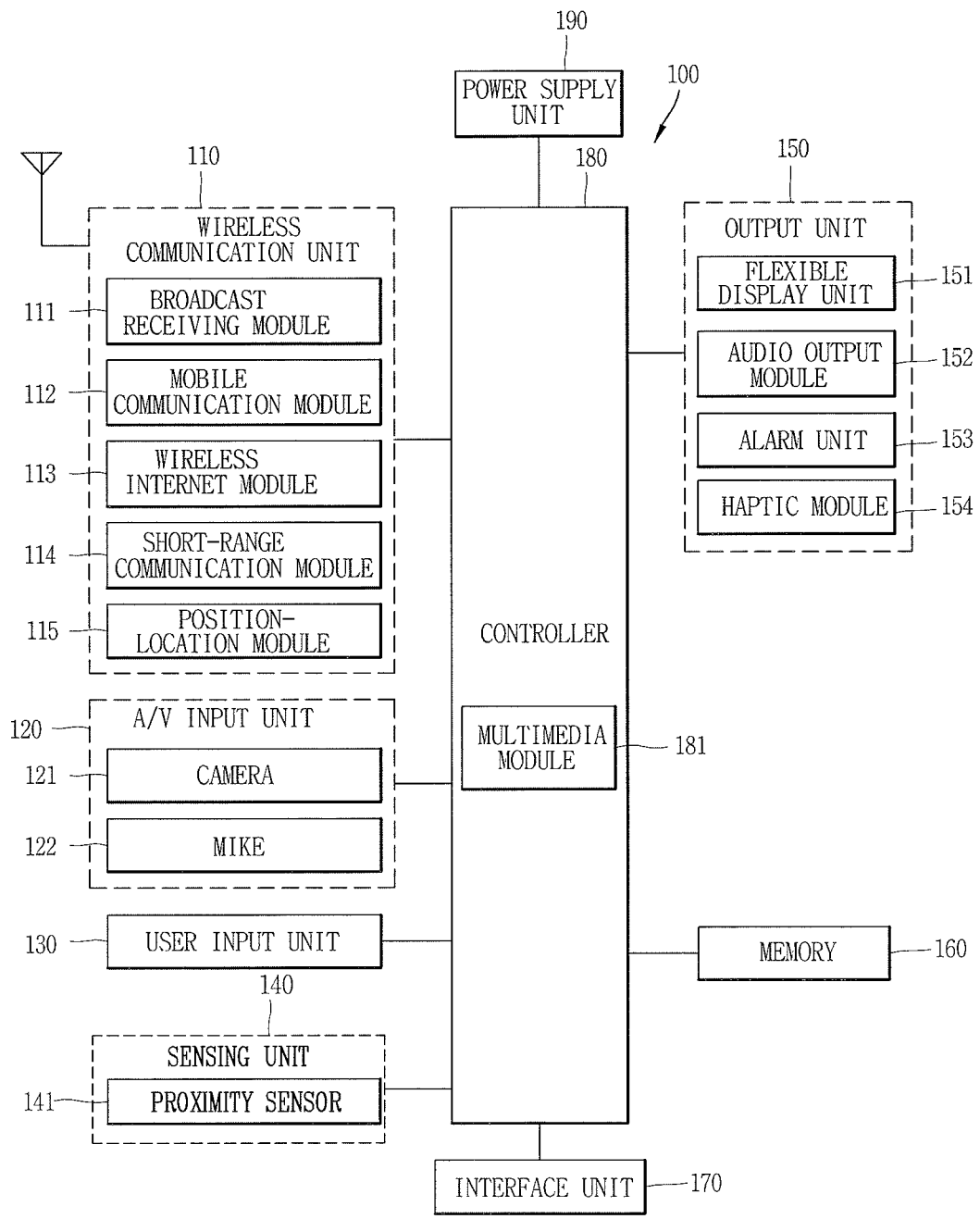
FIG. 1 is a block diagram of a mobile terminal in accordance with one exemplary embodiment of this specification.

FIG. 1 is a block diagram of a mobile terminal 100 in accordance with one embodiment of the present invention. The mobile terminal 100 may include a wireless communication unit 110, an A/V (Audio/Video) input unit 120, a user input unit 130, a sensing unit 140, an output unit 150, a memory 160, an interface unit 170, a controller 180, and a power supply unit 190, etc. FIG. 1 shows the mobile terminal as having various components, but it should be understood that implementing all of the illustrated components is not a requirement. Greater or fewer components may alternatively be implemented. The elements of the mobile terminal will be described in detail as follows.

The wireless communication unit 110 typically includes one or more components allowing radio communication between the mobile terminal 100 and a wireless communication system or a network in which the mobile terminal is located. For example, the wireless communication unit may include at least one of a broadcast receiving module 111, a mobile communication module 112, a wireless Internet module 113, a short-range communication module 114, and a location information module 115.

The broadcast receiving module 111 receives broadcast signals and/or broadcast associated information from an external broadcast management server (or other network entity) via a broadcast channel. The broadcast channel may include a satellite channel and/or a terrestrial channel. The broadcast management server may be a server that generates and transmits a broadcast signal and/or broadcast associated information or a server that receives a previously generated broadcast signal and/or broadcast associated information and transmits the same to a terminal. The broadcast signal may include a TV broadcast signal, a radio broadcast signal, a data broadcast signal, and the like. Also, the broadcast signal may further include a broadcast signal combined with a TV or radio broadcast signal. Examples of broadcast associated information may include information associated with a broadcast channel, a broadcast program, a broadcast service provider, and the like. The broadcast associated information may be provided via a mobile communication network, and received by the mobile communication module 112.

The broadcast associated information may be implemented in various formats. For instance, broadcast associated information may include Electronic Program Guide (EPG) of Digital Multimedia Broadcasting (DMB), Electronic Service Guide (ESG) of Digital Video Broadcast-Handheld (DVB-H), and the like.

The broadcast receiving module 111 may be configured to receive digital broadcast signals transmitted from various types of broadcast systems. Such broadcast systems may include Digital Multimedia Broadcasting-Terrestrial (DMB-T), Digital Multimedia Broadcasting-Satellite (DMB-S), Media Forward Link Only (MediaFLO), Digital Video Broadcast-Handheld (DVB-H), Integrated Services Digital Broadcast-Terrestrial (ISDB-T) and the like. The broadcast receiving module 111 may be configured to be suitable for every broadcast system transmitting broadcast signals as well as the digital broadcasting systems. Broadcast signals and/or broadcast associated information received via the broadcast receiving module 111 may be stored in a suitable device, such as a memory 160.

The mobile communication module 112 transmits/receives wireless signals to/from at least one of network entities (e.g., base station, an external mobile terminal, a server, etc.) on a mobile communication network. Here, the wireless signals may include audio call signal, video (telephony) call signal, or various formats of data according to transmission/reception of text/multimedia messages.

The wireless Internet module 113 supports wireless Internet access for the mobile terminal. This module may be internally or externally coupled to the mobile terminal 100. Examples of such wireless Internet access may include Wireless LAN (WLAN) (Wi-Fi), Wireless Broadband (Wibro), Worldwide Interoperability for Microwave Access (Wimax), High Speed Downlink Packet Access (HSDPA) and the like.

The short-range communication module 114 denotes a module for short-range communications. Suitable technologies for implementing this module may include BLUE- TOOTH™, Radio Frequency IDentification (RFID), Infrared Data Association (IrDA), Ultra-WideBand (UWB), ZigBee™, and the like.

The location information module 115 denotes a module for detecting or calculating a position of a mobile terminal. An example of the location information module 115 may include a Global Position System (GPS) module.

Referring to FIG. 1, the A/V input unit 120 is configured to provide audio or video signal input to the mobile terminal. The A/V input unit 120 may include a camera 121 and a microphone 122. The camera 121 receives and processes image frames of still pictures or video obtained by image sensors in a video call mode or a capturing mode. The processed image frames may be displayed on the output unit 150. The image frames processed by the camera 121 may be stored in the memory 160 or transmitted to the exterior via the wireless communication unit 110. Two or more cameras 121 may be provided according to the configuration of the mobile terminal.

The microphone 122 may receive an external audio signal while the mobile terminal is in a particular mode, such as a phone call mode, a recording mode, a voice recognition mode, or the like. This audio signal is processed into digital data. The processed digital data is converted for output into a format transmittable to a mobile communication base station via the mobile communication module 112 in case of the phone call mode. The microphone 122 may include assorted noise removing algorithms to remove noise generated in the course of receiving the external audio signal.

The user input unit 130 may generate input data input by a user to control the operation of the mobile terminal. The user input unit 130 may include a keypad, a dome switch, a touchpad (e.g., static pressure/capacitance), a jog wheel, a jog switch and the like.

The sensing unit 140 provides status measurements of various aspects of the mobile terminal. For instance, the sensing unit 140 may detect an open/close status of the mobile terminal, a change in a location of the mobile terminal 100, a presence or absence of user contact with the mobile terminal 100, the location of the mobile terminal 100, acceleration/deceleration of the mobile terminal 100, and the like, so as to generate a sensing signal for controlling the operation of the mobile terminal 100. For example, regarding a slide-type mobile terminal, the sensing unit 140 may sense whether a sliding portion of the mobile terminal is open or closed. Other examples include sensing functions, such as the sensing unit 140 sensing the presence or absence of power provided by the power supply 190, the presence or absence of a coupling or other connection between the interface unit 170 and an external device. Meanwhile, the sensing unit 140 may include a proximity sensor 141.

The output unit 150 is configured to output an audio signal, a video signal or a tactile signal. The output unit 150 may include a display unit 151, an audio output module 152, an alarm unit 153 and a haptic module 154.

The display unit 151 may output information processed in the mobile terminal 100. For example, when the mobile terminal is operating in a phone call mode, the display unit 151 will provide a User Interface (UI) or a Graphic User Interface (GUI), which includes information associated with the call. As another example, if the mobile terminal is in a video call mode or a capturing mode, the display unit 151 may additionally or alternatively display images captured and/or received, UI, or GUI. The display unit 151 may be implemented using, for example, at least one of a Liquid Crystal Display (LCD), a Thin Film Transistor-Liquid Crystal Display (TFT-LCD), an Organic Light-Emitting Diode (OLED), a flexible display, a three-dimensional (3D) display or the like. Some of such displays 151 may be implemented as a transparent type or an optical transparent type through which the exterior is visible, which is referred to as 'transparent display'. A representative example of the transparent display may include a Transparent OLED (TOLED), and the like. The rear surface of the display unit 151 may also be implemented to be optically transparent. Under this configuration, a user can view an object positioned at a rear side of a terminal body through a region occupied by the display unit 151 of the terminal body.

The display unit 151 may be implemented in two or more in number according to a configured aspect of the mobile terminal 100. For instance, a plurality of the displays 151 may be arranged on one surface to be spaced apart from or integrated with each other, or may be arranged on different surfaces.

Here, if the display unit 151 and a touch sensitive sensor (referred to as a touch sensor) have a layered structure therebetween, the structure may be referred to as a touch screen. The display unit 151 may be used as an input device rather than an output device. The touch sensor may be implemented as a touch film, a touch sheet, a touchpad, and the like. The touch sensor may be configured to convert changes of a pressure applied to a specific part of the display unit 151, or a capacitance occurring from a specific part of the display unit 151, into electric input signals. Also, the touch sensor may be configured to sense not only a touched position and a touched area, but also touch pressure.

When touch inputs are sensed by the touch sensors, corresponding signals are transmitted to a touch controller. The touch controller processes the received signals, and then transmits corresponding data to the controller 180. Accordingly, the controller 180 may sense which region of the display unit 151 has been touched.

Still referring to FIG. 1, a proximity sensor 141 may be arranged at an inner region of the mobile terminal 100 covered by the touch screen, or near the touch screen. The proximity sensor 141 indicates a sensor to sense presence or absence of an object approaching to a surface to be sensed, or an object disposed near a surface to be sensed, by using an electromagnetic field or infrared rays without a mechanical contact. The proximity sensor 141 has a longer lifespan and a more enhanced utility than a contact sensor.

Examples of the proximity sensor 141 may include a transmissive type photoelectric sensor, a direct reflective type photoelectric sensor, a mirror reflective type photoelectric sensor, a high-frequency oscillation proximity sensor, a capacitance type proximity sensor, a magnetic type proximity sensor, an infrared rays proximity sensor, and so on. When the touch screen is implemented as a capacitance type, proximity of a pointer to the touch screen is sensed by changes of an electromagnetic field. In this case, the touch screen (touch sensor) may be categorized into a proximity sensor.

Hereinafter, for the sake of brief explanation, a status that the pointer is positioned to be proximate onto the touch screen without contact will be referred to as 'proximity touch', whereas a status that the pointer substantially comes in contact with the touch screen will be referred to as 'contact touch'. For the position corresponding to the proximity touch of the pointer on the touch screen, such position corresponds to a position where the pointer faces perpendicular to the touch screen upon the proximity touch of the pointer.

The proximity sensor 141 senses proximity touch, and proximity touch patterns (e.g., distance, direction, speed, time, position, moving status, etc.). Information relating to the sensed proximity touch and the sensed proximity touch patterns may be output onto the touch screen.

The audio output module 152 may output audio data received from the wireless communication unit 110 or stored in the memory 160, in a call-receiving mode, a call-placing mode, a recording mode, a voice recognition mode, a broadcast reception mode, and so on. The audio output module 152 may output audio signals relating to functions performed in the mobile terminal 100, e.g., sound alarming a call received or a message received, and so on. The audio output module 152 may include a receiver, a speaker, a buzzer, and so on.

The alarm unit 153 outputs signals notifying occurrence of events from the mobile terminal 100. The events occurring from the mobile terminal 100 may include call received, message received, key signal input, touch input, and so on. The alarm unit 153 may output not only video or audio signals, but also other types of signals such as signals notifying occurrence of events in a vibration manner. Since the video or audio signals can be output through the display unit 151 or the audio output module 152, the display unit 151 and the audio output module 152 may be categorized into a part of the alarm unit 153.

The haptic module 154 generates various tactile effects which a user can feel. A representative example of the tactile effects generated by the haptic module 154 includes vibration. Vibration generated by the haptic module 154 may have a controllable intensity, a controllable pattern, and so on. For instance, different vibration may be output in a synthesized manner or in a sequential manner.

The haptic module 154 may generate various tactile effects, including not only vibration, but also arrangement of pins vertically moving with respect to a skin being touched (contacted), air injection force or air suction force through an injection hole or a suction hole, touch by a skin surface, presence or absence of contact with an electrode, effects by stimulus such as an electrostatic force, reproduction of cold or hot feeling using a heat absorbing device or a heat emitting device, and the like. The haptic module 154 may be configured to transmit tactile effects (signals) through a user's direct contact, or a user's muscular sense using a finger or a hand. The haptic module 154 may be implemented in two or more in number according to the configuration of the mobile terminal 100.

The memory 160 may store a program for the processing and control of the controller 180. Alternatively, the memory 160 may temporarily store input/output data (e.g., phonebook data, messages, still images, video and the like). Also, the memory 160 may store data related to various patterns of vibrations and audio output upon the touch input on the touch screen.

The memory 160 may be implemented using any type of suitable storage medium including a flash memory type, a hard disk type, a multimedia card micro type, a memory card type (e.g., SD or DX memory), Random Access Memory (RAM), Static Random Access Memory (SRAM), Read-Only Memory (ROM), Electrically Erasable Programmable Read-Only Memory (EEPROM), Programmable Read-Only Memory (PROM), magnetic memory, magnetic disk, optical disk, and the like. Also, the mobile terminal 100 may operate a web storage which performs the storage function of the memory 160 on the Internet.

The interface unit 170 may generally be implemented to interface the mobile terminal with external devices. The interface unit 170 may allow a data reception from an external device, a power delivery to each component in the mobile terminal 100, or a data transmission from the mobile terminal 100 to an external device. The interface unit 170 may include, for example, wired/wireless headset ports, external charger ports, wired/wireless data ports, memory card ports, ports for coupling devices having an identification module, audio Input/Output (I/O) ports, video I/O ports, earphone ports, and the like.

The identification module may be configured as a chip for storing various information required to authenticate an authority to use the mobile terminal 100, which may include a User Identity Module (UIM), a Subscriber Identity Module (SIM), and the like. Also, the device having the identification module (hereinafter, referred to as 'identification device') may be implemented in a type of smart card. Hence, the identification device can be coupled to the mobile terminal 100 via a port.

Also, the interface unit 170 may serve as a path for power to be supplied from an external cradle to the mobile terminal 100 when the mobile terminal 100 is connected to the external cradle or as a path for transferring various command signals input from the cradle by a user to the mobile terminal 100. Such various command signals or power input from the cradle may operate as signals for recognizing that the mobile terminal 100 has accurately been mounted to the cradle.

The controller 180 typically controls the overall operations of the mobile terminal 100. For example, the controller 180 performs the control and processing associated with telephony calls, data communications, video calls, and the like. The controller 180 may include a multimedia module 181 which provides multimedia playback. The multimedia module 181 may be configured as part of the controller 180 or as a separate component. The controller 180 can perform a pattern recognition processing so as to recognize writing or drawing input on the touch screen as text or image.

The power supply 190 provides power required by various components under the control of the controller 180. The provided power may be internal power, external power, or combination thereof.

Various embodiments described herein may be implemented in a computer-readable medium using, for example, software, hardware, or some combination thereof.

For a hardware implementation, the embodiments described herein may be implemented within one or more Application Specific Integrated Circuits (ASICs), Digital Signal Processors (DSPs), Digital Signal Processing Devices (DSPDs), Programmable Logic Devices (PLDs), Field Programmable Gate Arrays (FPGAs), processors, microprocessors, other electronic units designed to perform the functions described herein, or a selective combination thereof. In some cases, such embodiments are implemented by the controller 180.

For software implementation, the embodiments such as procedures and functions may be implemented together with separate software modules each of which performs at least one of functions and operations. The software codes can be implemented with a software application written in any suitable programming language. Also, the software codes may be stored in the memory 160 and executed by the controller 180.

Figure 2:
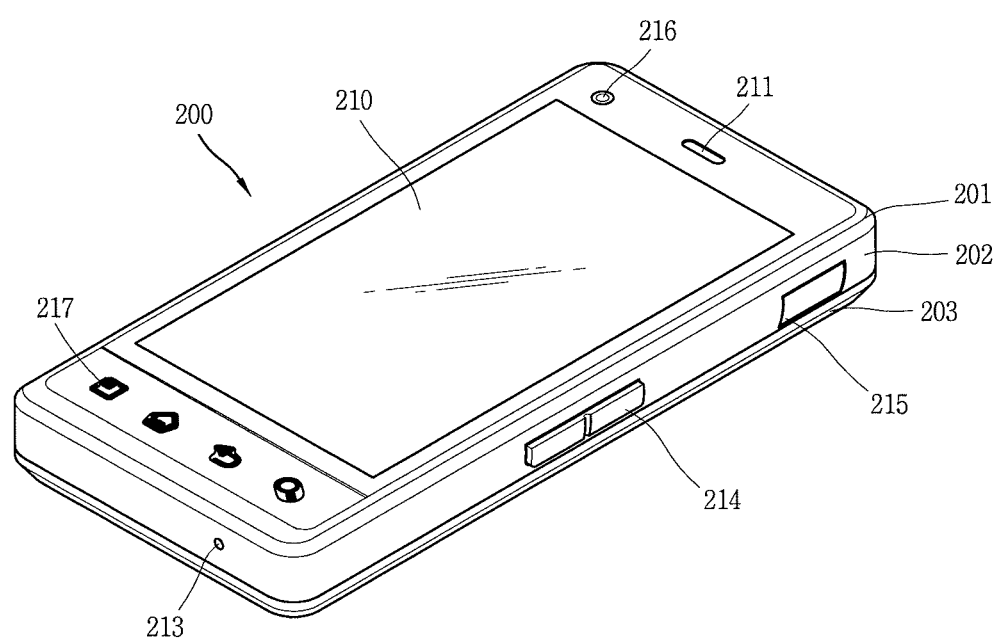
FIG. 2 is a front perspective view of the mobile terminal.
Figure 3:
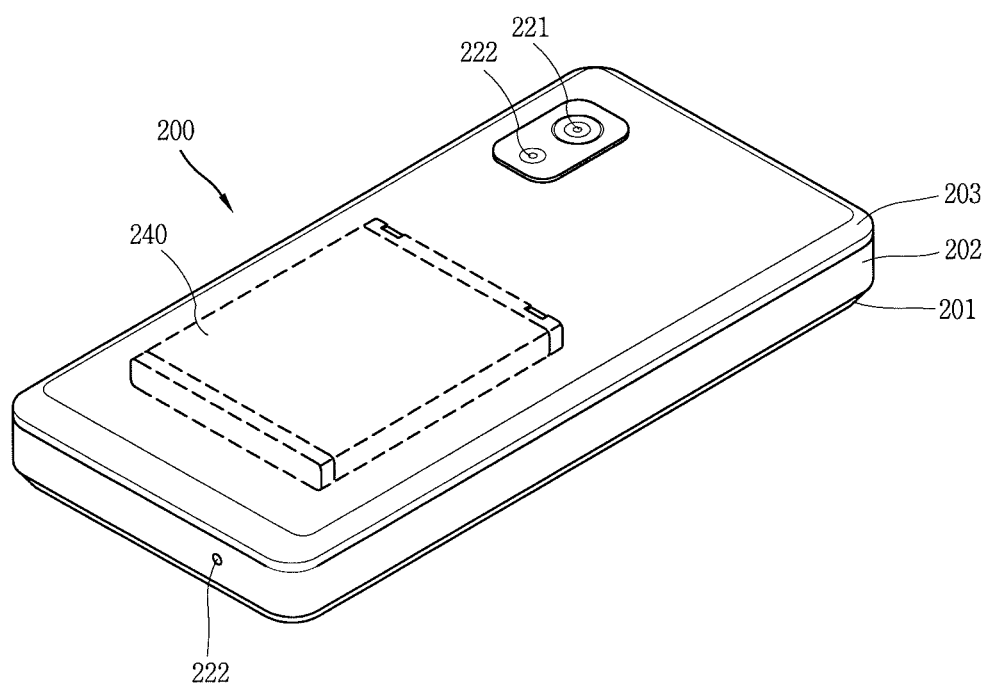
FIG. 3 is a rear perspective view of the mobile terminal shown in FIG. 2.

FIG. 2 is a front perspective view showing an example of the mobile terminal, and FIG. 3 is a rear perspective of the mobile terminal of FIG. 2. The mobile terminal 200 disclosed herein is provided with a bar-type terminal body. However, the present application is not limited to this type of terminal, but is also applicable to various structures of terminals such as slide type, folder type, swivel type, swing type, and the like, in which two or more bodies are combined with each other in a relatively movable manner. In addition, the mobile terminal described herein may also be applied to portable electronic devices having a camera and flash, for example, smart phones, cellular phones, notebook computers, digital broadcast terminals, Personal Digital Assistants (PDAs), Portable Multimedia Player (PMO) and the like.

The terminal body may include a case (or referred to as casing, housing, cover, etc.) defining an appearance of the mobile terminal 200. In this exemplary embodiment, the case may be divided into a front case 201, a rear case 202 for shielding a surface opposite to the front case 201, and a battery cover 203 coupled to the rear case 202 to define a rear surface of the mobile terminal 200. A space formed between the front and rear cases 201 and 202 may accommodate various electronic components. Such cases may be injected using a synthetic resin or be formed of a metal, such as stainless steel (STS), titanium (Ti) or the like.

The front surface of the terminal body may include a display module 210, a first audio output module 211, a front camera 216, a side key 214, an interface unit 215 and a signal input unit 217. The display module 210 may include an LCD module, an OLED module, an e-paper and the like to output visual information. The display module 210 may include a touch sensing unit to input information in a touching manner. Hereinafter, the display module 210 having the touch sensing unit may be referred to as 'touch screen.' When a touch input is sensed on a portion on the touch screen 210, contents corresponding to the touched position may be inputted. The contents inputted in the touching manner may be text or numerals, or menu items which may be indicated or set in various modes. The touch sensing unit may be transparent such that the display module can be visible, and include a structure for enhancing visibility of the touch screen at a bright place. Referring to FIG. 2, the touch screen 210 may occupy most of the front surface of the front case 201.

The first audio output module 211 may be implemented as a receiver to transfer a call sound to a user's ear, or a loud speaker for outputting various alarm sounds or multimedia reproduction sounds.

The front camera 216 may receive and process image frames of still pictures or video obtained by image sensors in a video call mode or a capturing mode. The processed image frames may be displayed on the display module 210. The image frames processed by the front camera 216 may be stored in the memory 160 or transmitted to an external device through the wireless communication unit 110. Two or more front cameras 216 may be provided according to the use environment of the mobile terminal.

The signal input unit 217 may be manipulated to allow inputting of commands for controlling operations of the mobile terminal 200, and include a plurality of input keys. The plurality of input keys may be referred to as a manipulating portion. Such manipulating portion can employ any tactile manner that a user can touch or tap for manipulation. For instance, the manipulating portion may be implemented as a dome switch, a touchpad, a touchpad or the like by which a user can input commands or information in a pushing or touching manner. Alternatively, the manipulating portion may be implemented as a wheel or a jog which rotates keys or a joystick. Contents inputted by the signal input unit 217 may be set in various manners. For example, the signal input unit 217 may be to input commands such as START, END or the like.

A side surface of the front case 201 is shown having a side key 214, an interface unit 215, an audio input unit 213 and the like. The side key 214 may be referred to as a manipulation unit, and allowed to receive command for controlling operations of the mobile terminal 200. The side key 214 may employ any tactile manner that a user can touch or tap for manipulation. Contents inputted by the side key 214 may be set in various manners. For example, the side key 214 may be configured to input commands, such as a control of the image input units 216, 221, a volume adjustment of sounds output from the audio output module 211, conversion of the display module 210 into a touch recognition mode, or the like.

The audio input unit 213 may be implemented, for example, as a microphone for receiving user's voice, other sounds and the like.

The interface unit 215 may serve as a path for data exchange between the mobile terminal 200 and external devices. For example, the interface unit 215 may be at least one of wired/wireless earphone ports, ports for short-range communication (e.g., IrDA, Bluetooth, WLAN, etc.), power supply terminals for power supply to the mobile terminal and the like. The interface unit 215 may be a card socket for coupling to external cards, such as a Subscriber Identity Module (SIM), a User Identity Module (UIM), a memory card for storage of information and the like.

A rear surface of the terminal body is shown having a power supply unit 240, and a rear camera 221. A flash 222 and a mirror (not shown) may additionally be disposed adjacent to the rear camera 221. The flash 222 operates in conjunction with the rear camera 221 when taking a picture using the rear camera 221. The mirror can cooperate with the rear camera 221 to allow a user to photograph himself in a self-portrait mode. The rear camera 221 faces a direction which is opposite to a direction faced by the front camera 216, and may have different pixels from those of the front camera 216. For example, the front camera 216 may operate with relatively lower pixels (lower resolution). Thus, the camera 121 may be useful when a user can capture his face and send it to another party during a video call or the like. On the other hand, the rear camera 221 may operate with a relatively higher pixels (higher resolution) such that it can be useful for a user to obtain higher quality pictures for later use. The front and rear cameras 216 and 221 may be installed in the terminal body to be rotatable or popped up.

The battery 240 for supplying power to the mobile terminal 200 may be mounted in the terminal body. The battery 240 may be mounted in the terminal body or detachably coupled directly onto the outside of the terminal body.

Figure 4:
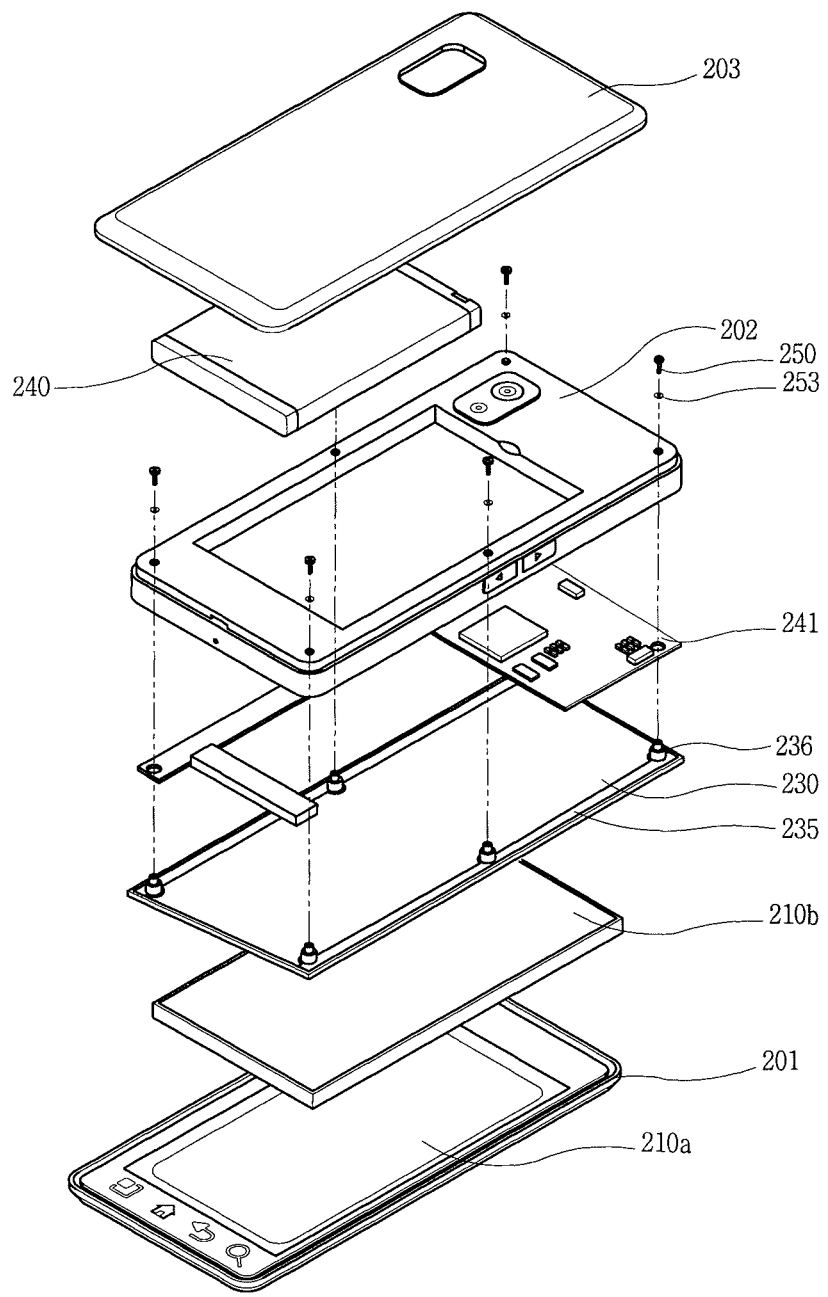
FIG. 4 is a disassembled perspective view of the mobile terminal shown in FIG. 3.

FIG. 4 is a disassembled perspective view of FIG. 3. As shown in FIG. 4, the mobile terminal 100 may include a window 210a and a display module 210b which are coupled to one surface of the front case 201 to configure the display unit 210. The front case 201 and the rear case 202 may define an appearance of the terminal, and a frame 230 for supporting electrical devices may be formed between the front case 201 and the rear case 202. The frame 230 serves to support the inside of the terminal. As one example, the frame 230 may be formed to support at least one of the display module 210b, a camera module 221, an antenna device or a printed circuit board 241.

The frame 230 may be partially exposed to the outside of the terminal. Also, in a slide type terminal other than a bar type, the frame 230 may configure a part of a sliding module by which a terminal body is connected to the display unit.

FIG. 4 shows an example that the printed circuit board 241 is located between the frame 230 and the rear case 202, and the display module 210b is coupled to one surface of the frame 230. The printed circuit board 241 and a battery 240 may be disposed on another surface of the frame 230, and a battery case 203 may be coupled to the rear case 202 to shield the battery 240.

The window 210a may be coupled to one surface of the front case 201. A touch sensor (not shown) may be mounted on the window 210a. The touch sensor may sense touch inputs, and be transparent. The touch sensor may be mounted on an entire surface of the window 210a. The touch sensor may convert the change in a voltage generated on a specific portion into an electrical input signal.

The display module 210b may be mounted onto the rear surface of the window 210a. This exemplary embodiment illustrates a Thin Film Transistor Liquid Crystal Display (TFT LCD) as an example of the display module 210b, but the present disclosure may not be limited to this type. Examples of the display module 210b may include an LCD, an Organic Light Emitting Diode (OLED), a flexible display, a Three-Dimensional (3D) display and the like.

The printed circuit board 241, as aforementioned, may be formed on one surface of the frame 230, but alternatively mounted onto a lower side of the display module 210b. At least one electronic device may be mounted on a lower surface of the printed circuit board 241.

The frame 230 may include a battery accommodating portion which is recessed to receive the battery 240 therein. A contact terminal, which is connected to the printed circuit board 241, may be formed at one side surface of the battery accommodating portion such that the battery 240 can supply power to the terminal body.

The antenna device may be formed at an upper end or lower end of the mobile terminal. Also, the antenna device may be provided in plurality, which are disposed at each end portion of the terminal. The antenna devices may transmit or receive wireless signals of different frequency bands, respectively.

The frame 230 may be made of a metal so as to maintain appropriate rigidity even if it is thin in thickness. The metallic frame 230 may operate as a ground. That is, the circuit board 241 or the antenna device may be grounded to the frame 230, and the frame 230 may operate as a ground of the printed circuit board 241 or the antenna device 242. Here, the frame 230 may extend the ground of the mobile terminal.

The frame 230 and the case may be coupled to each other by use of screws 250. At least one case may be interposed between the frame 230 and the screws 250. The cases may be the front case 201, the rear case 202 or an intermediate case.

When the screws 250 are coupled to the frame 230, the screws 250 may be exposed to the outside of the terminal body, which may allow static electricity to be discharged out of the terminal. Also, when the frame 230 operates as a ground, the frame 230 and the screws 250 may be coupled to each other, thereby extending the ground of the terminal. Here, the screw 250 may be coupled to another conductive member.

The frame 230 or the case may have boss units 236, 253, which are formed around holes in which the screws 250 are inserted. The boss units 236, 253 may be formed on edges of the terminal body, and additionally formed at a central area.

The boss units 236, 253 may be disposed between the screws 250 and one surface of the case or between the screws 250 and one surface of the frame 230, preventing the case or the frame 230 from being damaged, which may be caused when the screws 250 are fastened or loosed.

Figure 5:
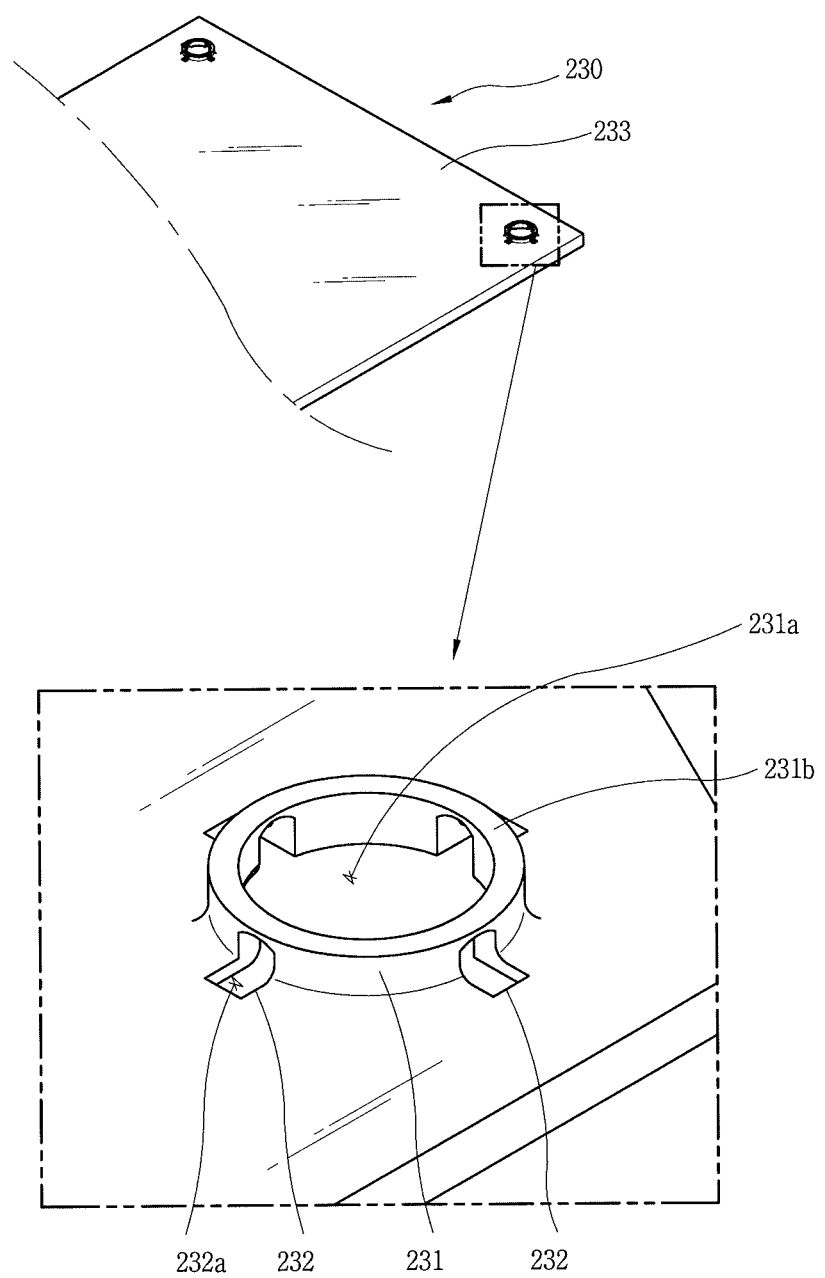
FIGS. 5 and 6 are front and rear perspective views, respectively, showing a frame in accordance with one exemplary embodiment.
Figure 6:
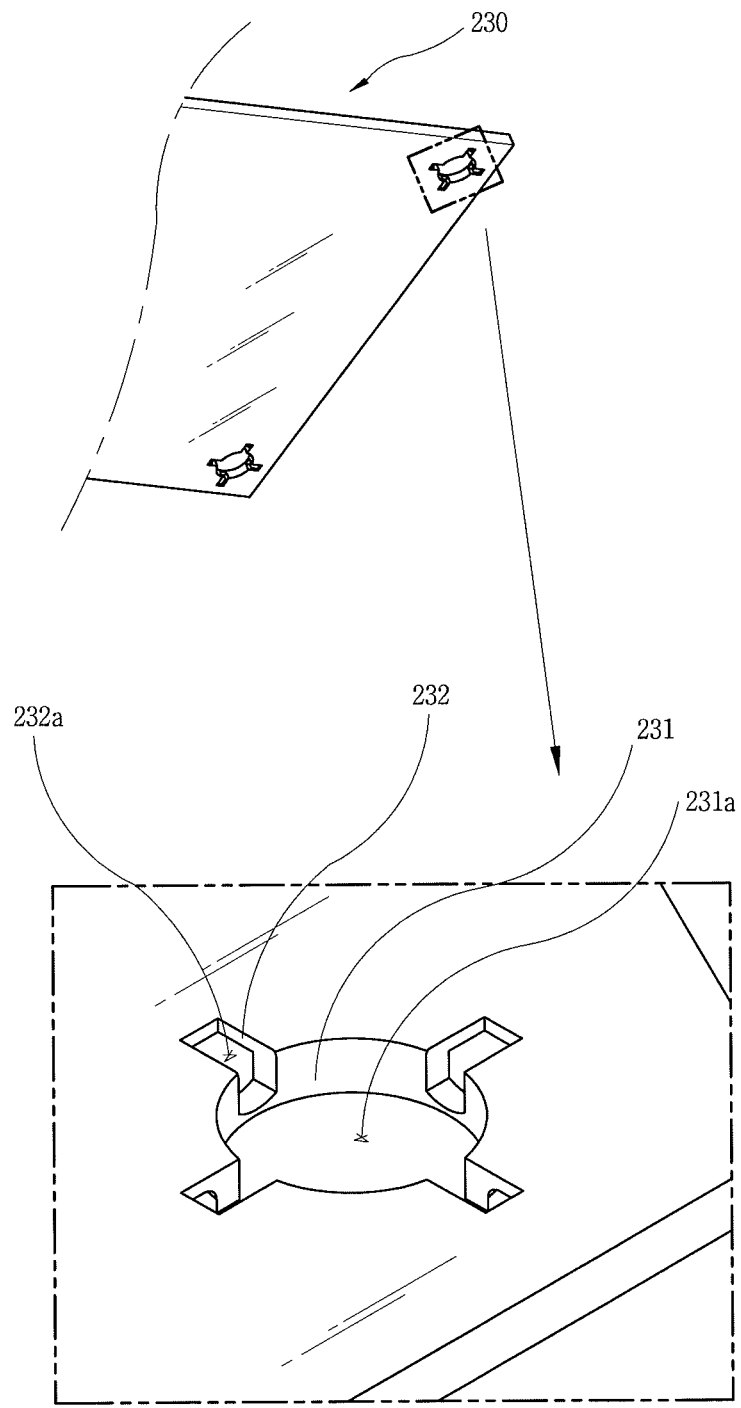
Figure 7:
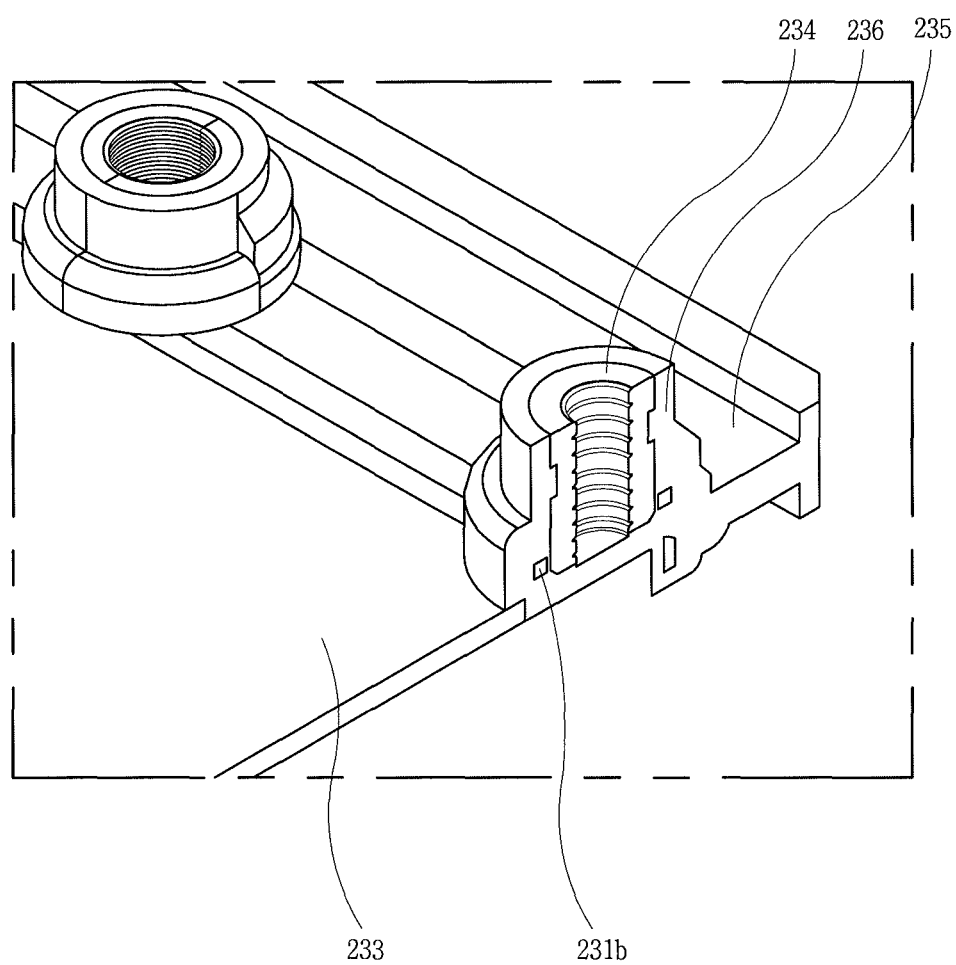
FIG. 7 is a conceptual view showing a state that a first boss unit is coupled to the frame.

Hereinafter, the frame 230 according to the one exemplary embodiment will be described in more detail with reference to FIGS. 5 and 6. FIGS. 5 and 6 are front and rear perspective views, respectively, showing the frame 230 in accordance with one exemplary embodiment, and FIG. 7 is a conceptual view showing a state that a first boss unit is coupled to the frame 230.

A shape of the frame 230 may not be limited. The frame 230 may be formed as a thin plate-like member. The frame 230 may be made of a metal or synthetic resin. Also, upon being made of the synthetic resin, the frame 230 may be partially plated or form a conductive pattern on its specific portion.

The frame 230 may include a frame body 233, a first coupling unit 231 and second coupling units 232. The first coupling unit 231 may protrude toward the case which is coupled to the frame 230. The first coupling unit 231 may have an annular shape protruding from one surface of the frame 230. The second coupling units 232 may be formed adjacent to the first coupling unit 231.

Each of the first coupling unit 231 and the second coupling units 232 may have a hole which is formed through the frame 230. Hereinafter, a hole formed on an inner circumference of the first coupling unit 231 may be called a first hole 231a, and a hole formed on an inner circumference of each second coupling unit 232 may be called a second hole 232a.

The first hole 231a may be greater than the second hole 232a in size. The first hole 231a may be coaxially coupled to a hole formed on the boss unit. The second hole 232a may be spaced apart from a center of the first hole 231a. The second hole 232a may be provided in plurality, which are disposed on an outer circumference of the first hole 231a by spaced distances. The second hole 232a may be spaced apart from the first hole 231a, and extend from the center to the outside of the first hole 231a.

One or more boss units may be coupled to the frame 230. Hereinafter, the boss unit coupled to the frame 230 may be referred to as a first boss unit 236. The first boss units 236 which are made of synthetic resin may be integrally formed with the frame 230 through injection molding. FIG. 7 shows an exemplary boss unit which is integrally formed with the frame 230 through the injection molding. The first boss unit 236 may be integrally coupled to the first coupling unit 231 and the second coupling unit 232. The first boss unit 236 may be integrally formed to fill the first hole 231a and the second hole 232a. The first boss unit 236 may cover an annular protruding portion 231b of the first coupling unit 231. This may allow the first boss unit 236 to be coupled to the frame 230 more firmly. Unlike this, a boss unit may be integrally coupled to the frame 230 by being adhered onto the frame 230 in a melting manner or by using an adhesive member such as a double-sided tape or adhesive.

The first boss unit 236 may be coaxially coupled to the first hole 231a. Or the first boss unit 236 may be connected to the first hole 231a. The first boss unit 236 may have a coupling member 234 formed on its inner circumference such that the screw 250 can be inserted therein. The coupling member 234 may have a screw groove on its inner circumferential surface such that the screw 250 can contact it upon being screwed. The coupling member 234 may be made of a metal and formed within the first boss unit 236, made of synthetic resin, by insert injection.

The plurality of first boss units 236, which are formed on the frame 230, may be connected to one another by a support portion 235. The support portion 235 may be formed to cover at least one surface of the frame 230. Here, the support portion 235 and the first boss units 236 may be integrally coupled to the frame 230 through injection molding. Hence, the non-conductive support portion 235 may be formed on at least one side of the conductive frame 230. The first boss units 236 may be integrally formed with the support portion 235.

Figure 8:
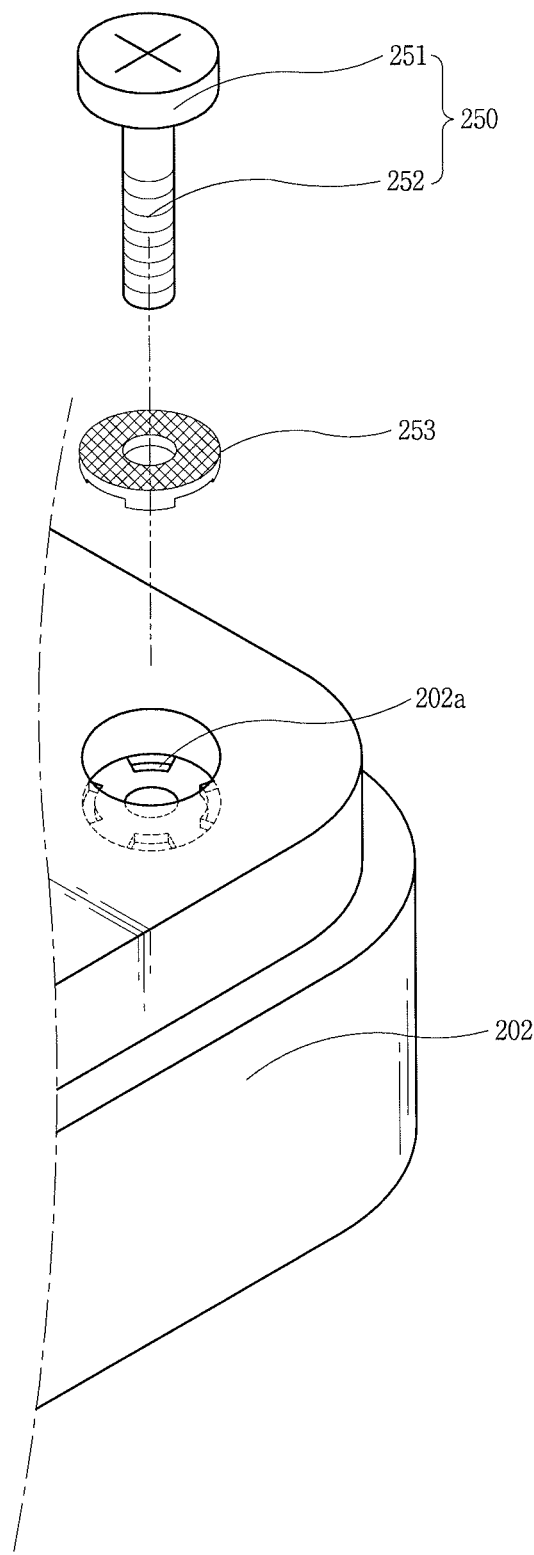
FIG. 8 is a conceptual view showing a case and a second boss unit.
Figure 9:
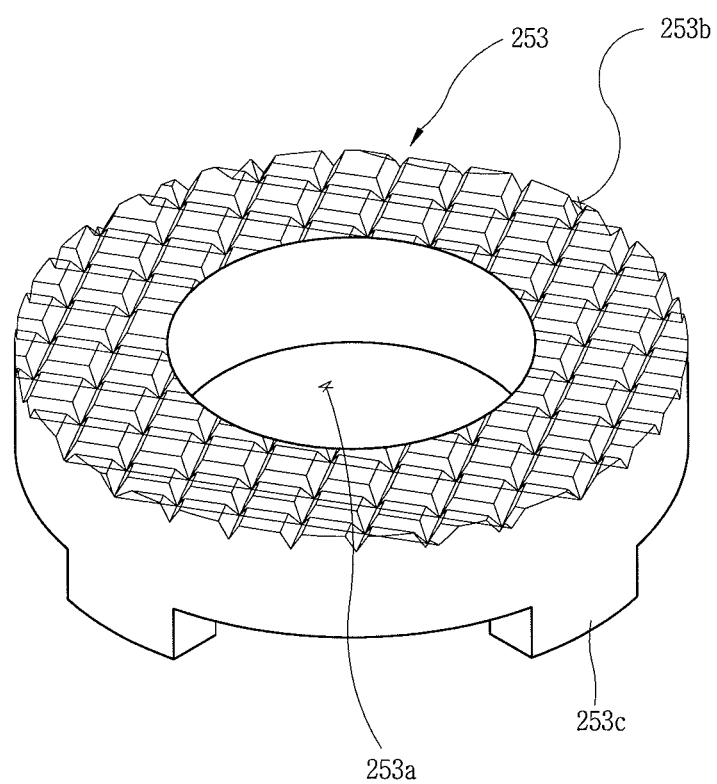
FIG. 9 is a perspective view of the second boss unit shown in FIG. 8.

FIG. 8 is a conceptual view showing a case and a second boss unit, and FIG. 9 is a perspective view of the second boss unit shown in FIG. 8. Here, the case may be the front case 201, the rear case 202 or the intermediate case which configure the terminal. The case may be molded by injecting synthetic resin. The case may include through holes through which it can be coupled to the frame 230 by use of the screws 250.

Each through hole may be coaxially coupled to the corresponding first boss unit 236. The screw 250 may be coupled to the first boss unit 236 by being inserted through the through hole from the upper portion of the case, thereby fixing the frame 230 to the case.

The screw 250 may have a head member 251 and a load member 252. The head member 251 may have a larger area than the through hole. That is, only the load member 252 may be inserted into the through hole, and the head member 251 may contact one surface of the case, which is located on an outer circumference of the through hole.

A boss unit (hereinafter, referred to as a second boss unit) may be formed on one surface of the case which the head member 251 contacts. The second boss unit 253 may have a concave-convex pattern to increase a frictional force with the head member 251. That is, a plurality of recesses 253b may be formed on one surface contacting the head member 251 of the second boss unit 253. The plurality of recesses 253b may be formed by finely etching one surface of the second boss unit 253 by laser processing. The second boss unit 253 may thusly have a surface roughness more than a predetermined level to increase a friction coefficient. This may increase the friction between the second boss unit 253 and the head member 251, thereby preventing the screw 250 from being loosed. The second boss unit 253 includes a through hole 253a through which the screw 250 can be inserted. The second boss unit 253 may include protrusions 253c protruding toward the coupled case. The case may include grooves 202a in which the protrusions 253a are inserted.

The second boss unit 253 and the case may be integrally processed by injection molding. Unlike this, the second boss unit 253 may be integrally coupled to the case by being adhered onto the case in a melting manner or by using an adhesive member such as a double-sided tape or adhesive. The second boss unit 253 may be made of a metal and the case may be made of synthetic resin, or vice versa. Also, the second boss unit 253 or the case may be made of synthetic resin, and a part thereof may be plated or patterned with a metal.

Figure 10:
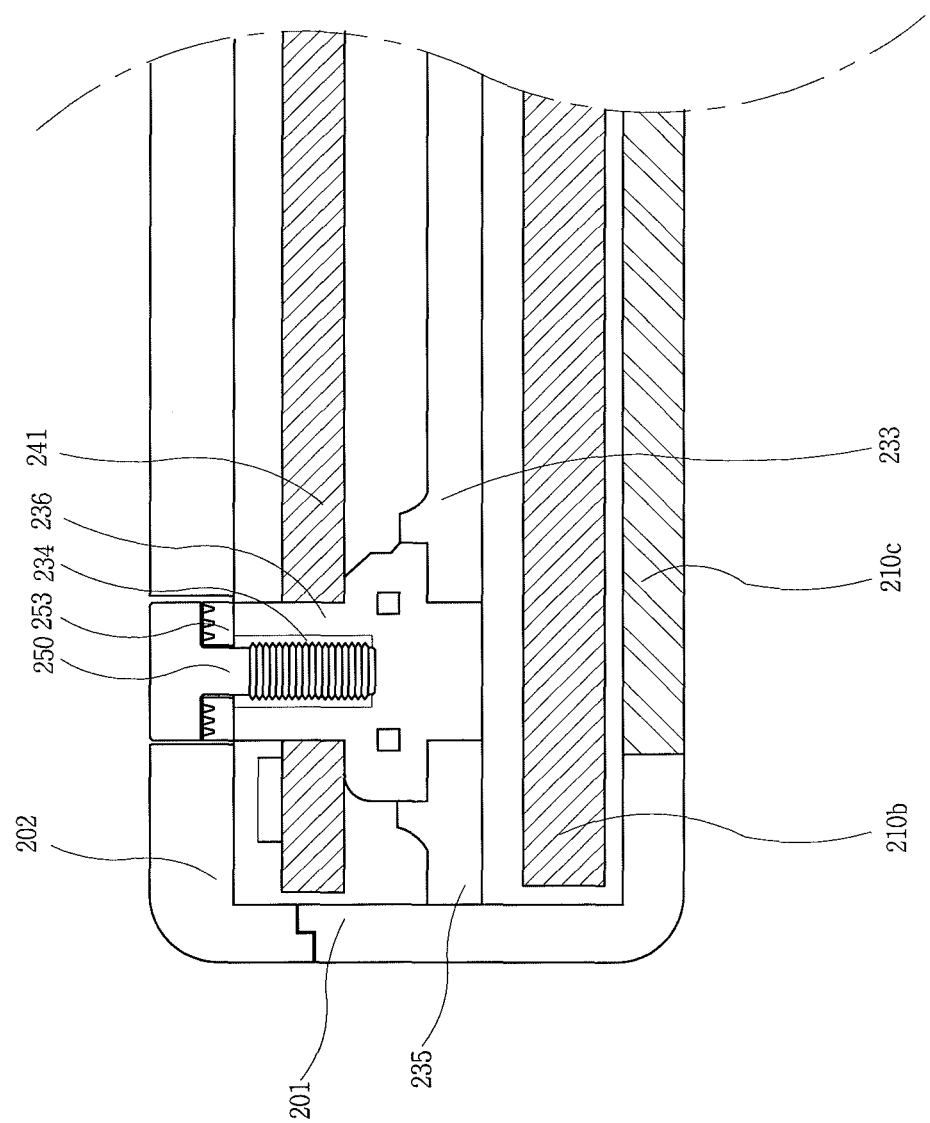
FIG. 10 is a sectional view showing a coupling relation among a case, a printed circuit board and a frame.

FIG. 10 is a sectional view showing a coupling relation among the case, the printed circuit board 241 and the frame 230. As shown in FIG. 10, the frame 230 may be formed between the front case 201 and the rear case 202. The display module 210b may be disposed on an entire surface of the frame 230, and the printed circuit board 241 may be disposed on a rear surface of the frame 230. Unlike this, the printed circuit board 241 may be disposed between the frame 230 and the display module 210b.

The printed circuit board 241 may have holes through which the first boss units 236 are inserted. As the first boss units 236 are inserted through the holes, the printed circuit board 241 may be supported by the first boss units 236 to be prevented from being laterally moved. A lower portion of each first boss unit 236 may have a larger diameter than an upper portion of the first boss unit 236. Accordingly, the printed circuit board 241 may be spaced apart from the frame 230 with being supported by the lower portions of the first boss units 236.

The screws 250 may be coupled to the first boss units 236 by being inserted from the upper portion of the rear case 202 via the second boss units 253, the rear case 202 and the printed circuit board 241. Accordingly, electrical devices such as the display module 210b may be mounted on the frame 230, and the frame 230 may be fixed to the rear case 202. As such, the first boss units 236 and the second boss units 253 may prevent damage to the case or the frame 230 when the case or the frame 230 is fixed by the screws 250. Also, the first and second boss units 236 and 253 may prevent loosing of the screws 250 so as to allow the frame 230 to be fixed to the case more firmly.

FIG. 10 shows an example which employs the boss units according to the one exemplary embodiment of the present disclosure. Unlike this drawing, one or more members which are fixed by the screws 250 may be disposed between the frame 230 and the case. Also, the frame 230 may not be disposed between the front case 201 and the rear case 202, but rather the frame 230 itself may be a case defining an appearance of the terminal.

The foregoing embodiments and advantages are merely exemplary and are not to be construed as limiting the present disclosure. The present teachings can be readily applied to other types of apparatuses. This description is intended to be illustrative, and not to limit the scope of the claims. Many alternatives, modifications, and variations will be apparent to those skilled in the art. The features, structures, methods, and other characteristics of the exemplary embodiments described herein may be combined in various ways to obtain additional and/or alternative exemplary embodiments.

As the present features may be embodied in several forms without departing from the characteristics thereof, it should also be understood that the above-described embodiments are not limited by any of the details of the foregoing description, unless otherwise specified, but rather should be construed broadly within its scope as defined in the appended claims, and therefore all changes and modifications that fall within the metes and bounds of the claims, or equivalents of such metes and bounds are therefore intended to be embraced by the appended claims.

What is claimed is:

1. A mobile terminal comprising:
   a case defining an appearance of the mobile terminal;
   a frame coupled to the case and configured to support electrical devices, the frame including:
   a first coupling unit provided at the frame such that the frame is fixable to the case, the first coupling unit having a first hole formed therein; therein, the first coupling unit having an annular portion protruding from one surface of the frame; and
   a second coupling unit provided at the frame and located adjacent to the first coupling unit, the second coupling unit having a second hole formed therein, the first hole being greater in size than the second hole; and
   a first boss unit integrally coupled to the first coupling unit and the second coupling unit, the first boss unit being formed to fill the first hole and the second hole,
   wherein the second hole is disposed on an outer circumference of the first hole, spaced apart from the first hole, and extends from a center to outside of the first hole, and
   wherein the first boss unit covers the annular portion.

2. The mobile terminal of claim 1, wherein the second coupling unit is spaced apart from the first coupling unit, the second coupling unit being provided in plurality.

3. The mobile terminal of claim 1, wherein the first coupling unit has at least a portion protruding toward the case.

4. The mobile terminal of claim 3, wherein the first boss unit covers the protruding portion of the first coupling unit.

5. The mobile terminal of claim 1, wherein the first boss unit extends from the frame towards the case.

6. The mobile terminal of claim 5, wherein the first boss unit includes a coupling member with a threaded hole, the coupling member being formed along an inner circumference of the first boss unit and configured to receive a fastener therein.

7. The mobile terminal of claim 6, wherein the coupling member is formed with the first boss unit by injection molding.

8. The mobile terminal of claim 6, wherein the case comprises a through hole arranged coaxial to the threaded hole of the first boss unit.

9. The mobile terminal of claim 8, further comprising a fastener inserted into the first boss unit via the through hole, the fastener having a head member contacting one surface of the case and a load member coupled to the coupling member, and wherein the case comprises a second boss unit located at one surface thereof, the second boss unit having a concavo-convex pattern to increase friction between the head member and the second boss unit.

10. The mobile terminal of claim 9, wherein the case comprises a plurality of grooves formed at said one surface, and wherein the second boss unit includes a plurality of protrusions corresponding to the plurality of grooves, the plurality of protrusions being inserted into the plurality of grooves.

11. The mobile terminal of claim 9, wherein the case is made of synthetic resin and the second boss unit is made of a metal.

12. The mobile terminal of claim 10, wherein the second boss unit and the case are formed with each other by injection molding.

13. The mobile terminal of claim 1, wherein the frame is made of a metal and the first boss unit is formed of synthetic resin.

14. The mobile terminal of claim 13, wherein the first boss unit includes a support portion and the support portion extends to cover at least one side surface of the frame.

* * * * *